United States Patent
Lindner et al.

(10) Patent No.: US 8,763,239 B2
(45) Date of Patent: Jul. 1, 2014

(54) SYSTEM FOR UNIFORM STRUCTURING OF SUBSTRATES

(75) Inventors: Friedrich Paul Lindner, Schärding (AT); Thomas Glinsner, St. Florian/Inn (AT); Markus Wimplinger, Ried im Innkreis (AT)

(73) Assignee: EV Group E. Thallner GmbH, St. Florian (AT)

( * ) Notice: Subject to any disclaimer, the term of this patent is extended or adjusted under 35 U.S.C. 154(b) by 172 days.

(21) Appl. No.: 12/266,630

(22) Filed: Nov. 7, 2008

(65) Prior Publication Data

US 2009/0151154 A1    Jun. 18, 2009

(30) Foreign Application Priority Data

Nov. 8, 2007    (EP) ..................................... 07021676

(51) Int. Cl.
*B23P 19/00* (2006.01)
*B41L 3/02* (2006.01)
*B41L 3/08* (2006.01)
*G01G 23/02* (2006.01)
*B29C 59/02* (2006.01)
*G03F 7/00* (2006.01)

(52) U.S. Cl.
CPC ............ *B29C 59/022* (2013.01); *G03F 7/0002* (2013.01); *B29C 2059/023* (2013.01)
USPC .............................. 29/760; 101/486; 177/154

(58) Field of Classification Search
CPC ................ B29C 59/022; G03F 7/0002; H01L 21/67121; B41F 27/005; G01G 23/005
USPC .............................. 29/760; 101/486; 177/154
See application file for complete search history.

(56) References Cited

U.S. PATENT DOCUMENTS

| 5,205,369 A * | 4/1993 | Neeleman ..................... 177/229 |
| 7,117,790 B2 * | 10/2006 | Kendale et al. ................ 101/327 |
| 7,432,634 B2 | 10/2008 | Choi et al. ............... 310/323.17 |
| 2007/0141191 A1 | 6/2007 | Kruijt-Stegeman et al. ......................... 425/174.4 |

FOREIGN PATENT DOCUMENTS

| DE | 20122179 | 9/2004 | ............... G03F 7/00 |
| EP | 1480077 | 11/2004 | ............... G03F 7/00 |
| JP | 2005-268675 | 9/2005 | ........... H01L 21/027 |
| JP | 2006-116602 | 5/2006 | ............... B30B 5/00 |
| JP | 2007-227890 | 9/2007 | ........... H01L 21/027 |

OTHER PUBLICATIONS

Notification of Reason for Rejection (dated Jun. 4, 2013) issued in connection with corresponding Japanese Patent Application No. 2008-286980, with English translation.

* cited by examiner

*Primary Examiner* — David Angwin
(74) *Attorney, Agent, or Firm* — Kusner & Jaffe

(57) ABSTRACT

A system for transferring a nanostructure from a die to a flat side of a large-area substrate. The system has a substrate holder that receives the substrate on a substrate receiving surface. A structural surface of the die is oriented parallel to and opposite the substrate receiving surface. An adjusting means receives the substrate holder and adjusts the position of the substrate relative to the die in an x-direction, y-direction and a rotational direction. An actuator device includes at least two separately controllable actuators that each independently imposes a force in a direction orthogonal to the substrate receiving surface. A force measuring cell is in each actuator for measuring the force applied on the die or substrate. The forces, in combination, produce a single, controllable resultant force at a predetermined location. The single, resultant force is orientated in a direction orthogonal to the substrate receiving surface of the substrate holder.

20 Claims, 7 Drawing Sheets

SYSTEM FOR UNIFORM STRUCTURING OF SUBSTRATES

FIELD OF THE INVENTION

The invention relates to a system for transferring a structure.

BACKGROUND OF THE INVENTION

The invention relates to a micro- or nanostructure, from a die to a flat side of a large-area substrate with a substrate holder that receives the substrate on a substrate receiving surface, and an actuator device that can be oriented parallel to the substrate receiving surface and opposite to this movable structural surface of the die and that acts orthogonally to the substrate receiving surface.

The structuring of substrates, for example wafers, is done by embossing or stamping, whereby the procedure is to operate either with a die, whose die structural surface corresponds to the size of the surface to be structured on the substrate, or smaller dies are used, which introduce to the substrate a repeating structure in several steps in the so-called step-and-repeat process. While large dies are expensive and difficult to produce, the die process lasts considerably longer in the case of very small dies based on orientation that has to be done multiple times and the many intermediate steps. Moreover, large dies, in particular in the nanometer range, can be used only in the case of very flat substrates. In the step-and-repeat process, the additional problem is that in particular in round substrates and square dies, specific areas of the substrate are not picked up by the die and corresponding scrapping is produced. The more completely the available substrate surface can be structured, the higher is the edge yield, also named Edge Die Yield.

An optimum edge yield would be achieved by reducing the die size to chip dimensions, i.e., a self-enclosed structure. Typical chip sizes are, for example, 100 μm×100 μm up to 80 mm×80 mm. When using such small dies, the throughput would drop and thus the production costs of chips would increase considerably.

Dies with an asymmetrical die structure, also called an asymmetrical filling factor, cause the largest problem, since the die can tilt and/or drift during embossing of the substrate, and an uneven structuring, in the worst case leading to scrapping, is the result.

SUMMARY OF THE INVENTION

This is where the invention comes in; its object is to improve the generic systems to the extent that with dies that can be produced at a reasonable price, a homogenous structure can be applied to the substrates with the highest possible throughput and the best possible edge yield without scrapping.

This object is achieved with the features of claim 1. Advantageous further developments of the invention are indicated in the subclaims. All combinations that consist of at least two of the features indicated in the specification, the claims and/or the drawings also fall within the scope of the invention.

The invention is based on the idea of indicating a system with which the resultant force that acts on the substrate surface by the die can be moved along the die surface.

By these measures, it is possible, on the one hand, to introduce optimally the die force even when stamping with asymmetrical filling factor and to avoid drifting or tilting or blocking the die. On the other hand, by such a system, the possibility arises to use the die even on the edge of the substrate in an overlapping manner, by which the edge yield can be increased up to 100%.

In terms of this invention, embossing also includes dies. The term nanostructure means structures<1 μm average distance between individual protrusions of the substrate structure or the die structure, i.e., also structures<1 nanometer. It is also conceivable, however, to process structures<5 mm.

The generic system is configured according to the invention such that the actuator device has at least two separately controllable and/or regulatable actuators for imposing on the die or substrate a force Fa that ensures the transfer of the nanostructure and whose resultant is orthogonal to the substrate receiving surface.

By these measures, on the one hand, a parallel positioning of the die before each stamping or embossing process is possible, whereby the regulation of the actuators can be done based on position or force. The positional regulation can be done by a stepper motor, while the force regulation can be done by measuring the force that is present at each actuator.

The topography of the die or the filling factor of the die can be measured before the stamping process to appropriately control the actuator and to preset the resultant force Fa on the substrate surface. Such asymmetrical structures occur, for example, during hot embossing or UV embossing.

By the configuration according to the invention, the force of the actuators can be put exactly in the centroid of the area of the active stamping surface, by which a uniform embossing/stamping is achieved even when only partial areas of the die are used.

An optimum behavior between throughput and stamping costs is achieved by matching the die size to 1/1 to 1/5,500,000, preferably 1/10 to 1/50, of the substrate surface to be structured, whereby this matching depends on, i.a., the respective application. In the case of small substrates, such as, for example, hard disks, 1/1 is ideal, while in the case of large substrates, such as, for example, for LCD screens, 1/5,500,000 is optimum.

The actuator device can, as described above, exert the force directly or indirectly on the die, whereby the substrate rests on the rigid substrate receiving surface in the direction of the die. Conversely, the actuator device may also act on the substrate receiving surface, however, while the die is secured in the stamping direction.

The resultant force that acts on the die by the actuators can be moved at will over the distance between the actuators by changing the force Fn that is present in each case on the individual actuator. When using two actuators, the resultant force can be imposed on any part of the die by shifting the actuators in parallel.

It is especially advantageous in this case that in each case, separately controlled and/or regulated tensile and/or compressive forces Fn can be adjusted in the actuators. For this purpose, the stamping and separation forces can be metered exactly.

A central control and adjustment or presetting of values is possible if actuators can be controlled by a central control device that is connected to the actuators via control lines.

In an especially advantageous embodiment of the invention, the actuator device has three separately controllable and/or adjustable actuators. Thus, the resultant force or the ratios of the individual tensile and/or compressive forces Fn over the stamping surface can be shifted and metered by themselves by the control of the tensile and/or compressive forces.

An optimum distribution of the tensile and/or compressive forces produced by the actuators is achieved on the die by the actuator device having a die holder that transfers tensile and/or compressive forces Fn to the die, in particular receiving the die in a central location.

In addition, it is advantageous for the calculation of the force distribution to arrange the actuators uniformly distributed on the periphery of the die holder, in particular with an intermediate angle α of 120° in each case between adjacent actuators.

The above-mentioned also applies in the arrangement of the actuator device on the substrate holder.

The entire structural surface of the die can be reached with the resultant force Fa by the actuators escaping outside of the structural surface, i.e., by the planes formed by the structural surface intersecting outside of the structural surface.

An adjusting device provided inside the system for translatory and rotating orientation of the substrate parallel to the die can ensure the orientation and shifting of the substrate to the die, in particular after each stamping process.

It is especially advantageous to arrange the adjusting device, the substrate holder and the die between a lower base plate and a die base plate that is oriented parallel to the lower base plate. In this respect, the parallel orientation of substrate and die and the orthogonal orientation of actuators to die are facilitated.

In this case, the actuators can advantageously run through the die base plate and be guided into the latter orthogonally to the die base plate.

The measurement of the compressive and/or tensile forces of the actuators is carried out advantageously by force measuring cells, strain gauges or resistance measuring cells provided between die or substrate and each of the actuators.

The force measuring cells are advantageously connected via control lines to the central control device, and the central control device is the actuator with which in each case the measurement value of the corresponding force measuring cell, associated with the actuator, is designed in a controlling and/or regulating manner. The use of at least two force measuring cells, one each for each actuator, allows a balancing of the stamping force during stamping or separating. By the balancing, a ridge that may develop due to an asymmetric filling factor or drifting is further compensated.

The system can advantageously also be operated in a vacuum, by which advantageously air pockets are avoided and a more precise structural transfer is possible.

In this case, it is especially advantageous that the resultant force Fa can take effect by the control of the actuator device in the centroid of the area of a contact surface between substrate and die.

Also, an anti-adhesive layer is optionally provided on the substrate. In this case, another advantage of the invention lies in that while the die is being demolded, the tensile force can be measured. Consequently, the condition of the anti-adhesive layer can be determined. The plot of the tensile force over a number of die-molding processes allows a determination of the service life of the anti-adhesive layer and thus a preventive maintenance (renewal of the layer or the die).

BRIEF DESCRIPTION OF THE DRAWINGS

Other advantages, features and details of the invention arise from the subsequent specification of preferred embodiments as well as based on the drawings. The latter show in:

FIG. 1b: A side view of the system according to FIG. 1a;

FIG. 2b: The system of the invention according to FIG. 2a;

DETAILED DESCRIPTION OF PREFERRED EMBODIMENT

In the figures, the same components and components with the same function are identified with the same reference numbers.

Figure 1A:
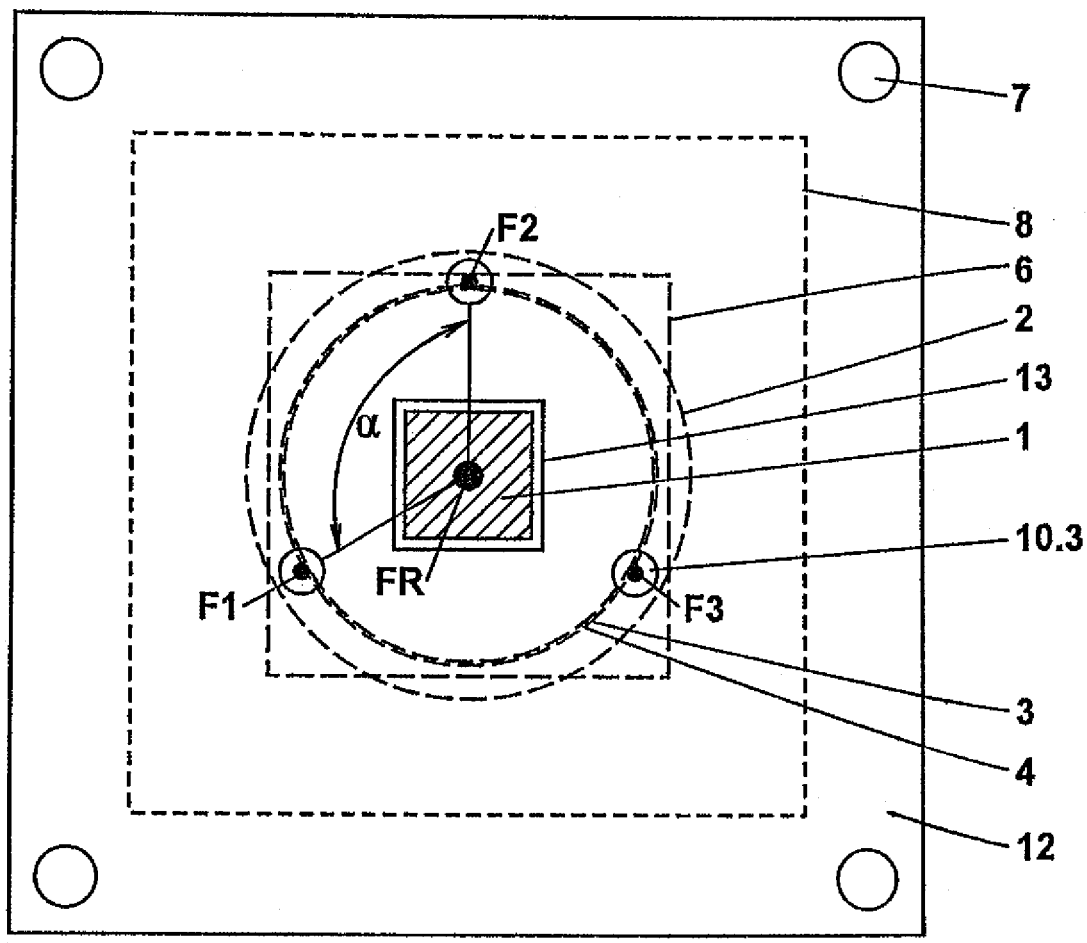
FIG. 1a: A diagrammatic overview of the system according to the invention in the case where the resultant force Fa centrally acts on the die and the full surface of the die is used.
Figure 1B:
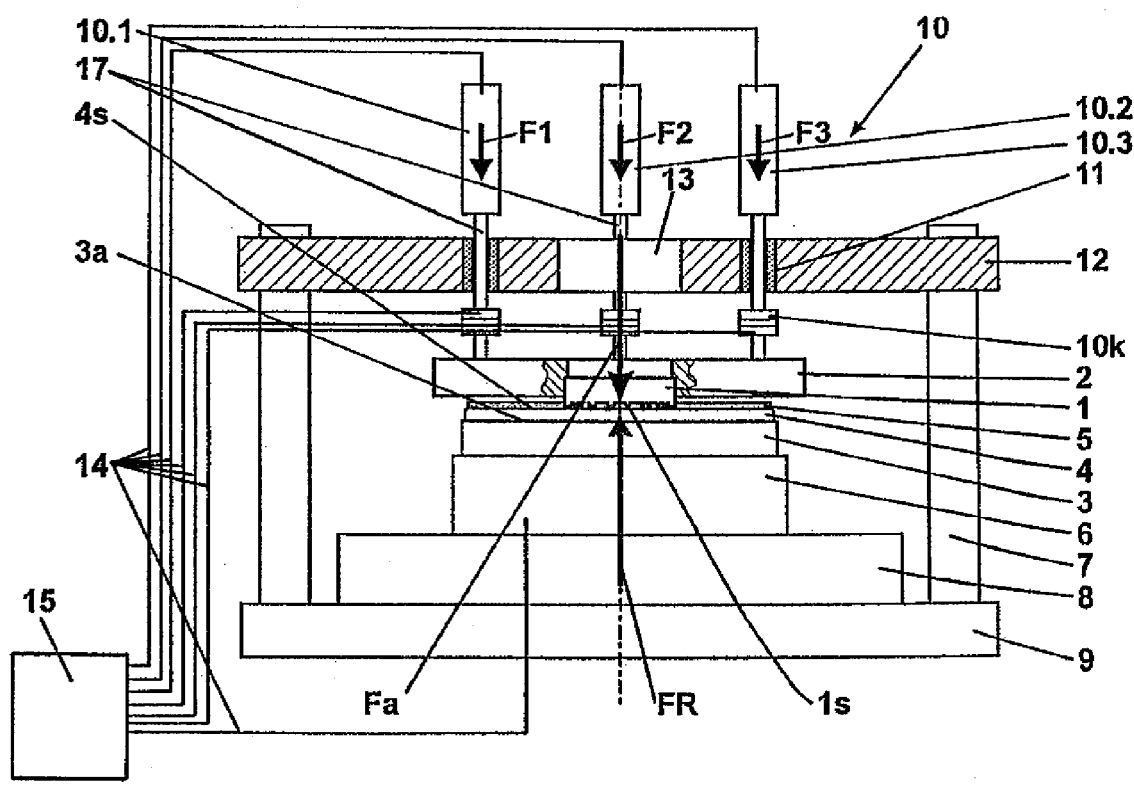
Figure 2A:
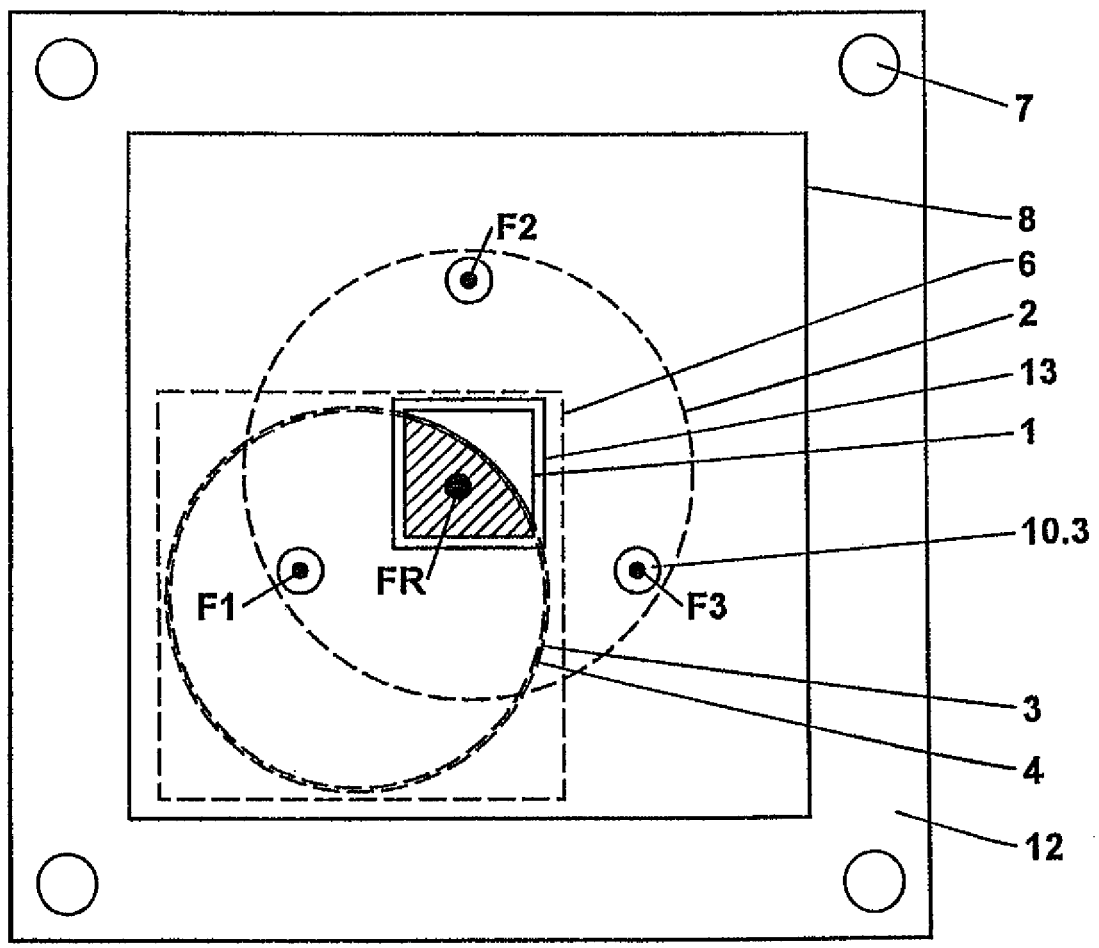
FIG. 2a: The system according to the invention with resultant force Fa acting centrally on the die.
Figure 2B:
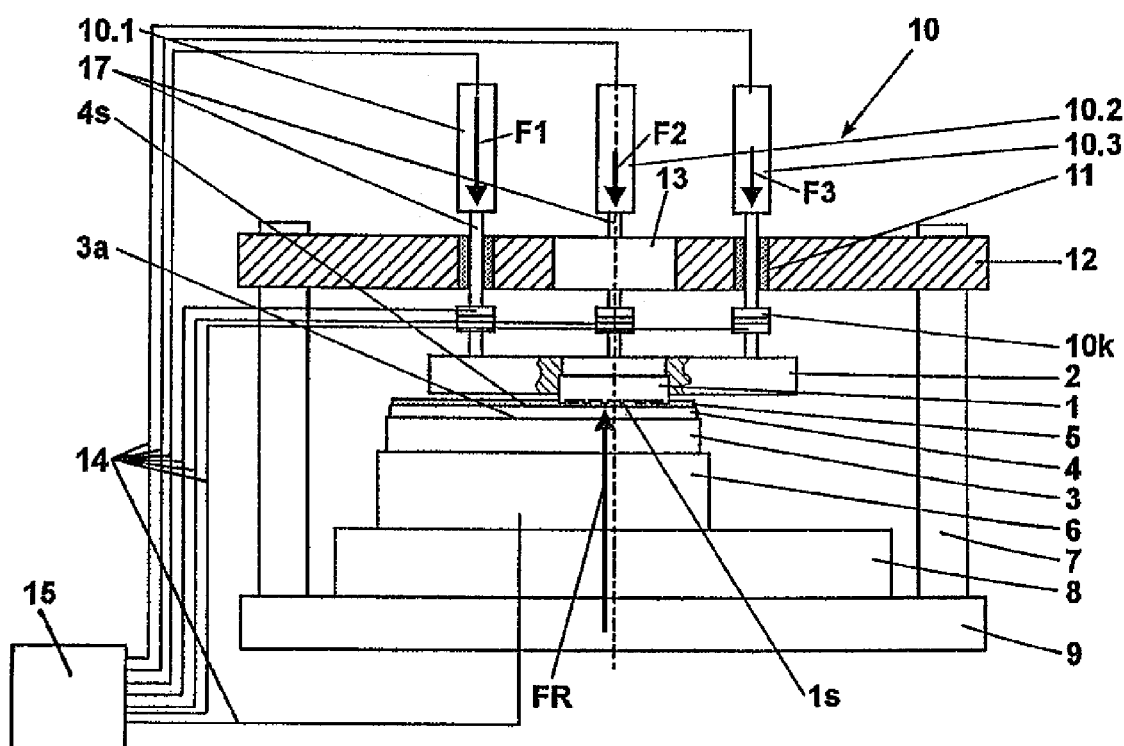

In FIGS. 1a and 1b, the system according to the invention is shown in one die step of the step-and-repeat process, in which the middle area of a substrate 4 is embossed. In FIGS. 2a and 2b, however, an edge area (shaded) is embossed, and thus compressive forces F1, F2, and F3, shown in arrow representation, of actuators 10.1, 10.2 and 10.3 are unevenly distributed to move a resultant counterforce FR into a centroid of the area of a contact surface of die 1 with the substrate 4.

However, the compressive forces F1, F2 and F3 that are shown in FIG. 1b are uniformly distributed, since the dies 1 are uniformly separated into the actuators 10.1, 10.2 and 10.3 or the pressure transfer rods 17 thereof, which are attached to a die holder 2, which centrically receives the die 1.

The die holder 2 is used, on the one hand, to secure the die 1 and uniform force transfer, and, on the other hand, it makes possible the simpler exchange of the die 1 if a new nanostructure 16 has to be applied on the substrate 4.

The system and the components thereof are essentially supported by a lower base plate 9, which is formed by four connecting supports 7 projecting vertically upward at the edges of the base plate 9 connected to a die base plate 12. Base plate 9 and die base plate 12 are flat and oriented parallel to one another.

An adjusting table base plate 8 is arranged on the base plate 9, which in turn receives an adjusting table 6. The latter provides for the shifting of the components arranged on the adjusting table 6, described below, relative to the adjusting table base plate 8 in the x-direction, the y-direction and in rotational direction, e.g., in translatory and rotary fashion.

A substrate holder 3, which receives the substrate 4 with a possible polymer layer 5, is secured on the adjusting table 6, whereby the polymer layer 5, for example, can be applied via a window 13 in the die base plate 12.

Opposite and parallel to the substrate 4, the structural surface 1s of the die 1 is arranged, and the die 1 is securely lodged in the middle of the die holder 2, which in turn is held by three pressure transfer rods 17 applied on the surface of the die holder 2 on the side of the die holder 2 that faces away from the die 1. The pressure transfer rods 17 are each associated with one of the three actuators 10.1, 10.2 and 10.3 and slide into a guide 11 in the die base plate 12 orthogonally to the die base plate 12 or orthogonally to the substrate 4 and the die 1. In each pressure transfer rod 17, force measuring cells 10k are integrated, which measure the tensile and/or compressive forces F1, F2, and F3 and transfer to the central control device 15 over connecting lines 14.

By the measured values obtained or called from the force measuring cells 10k, the central control device 15 provides that the die surface 1s of the die 1 is pressed with homogeneous pressure on the substrate 4, without the ridge or drift effect developing.

Figure 4:
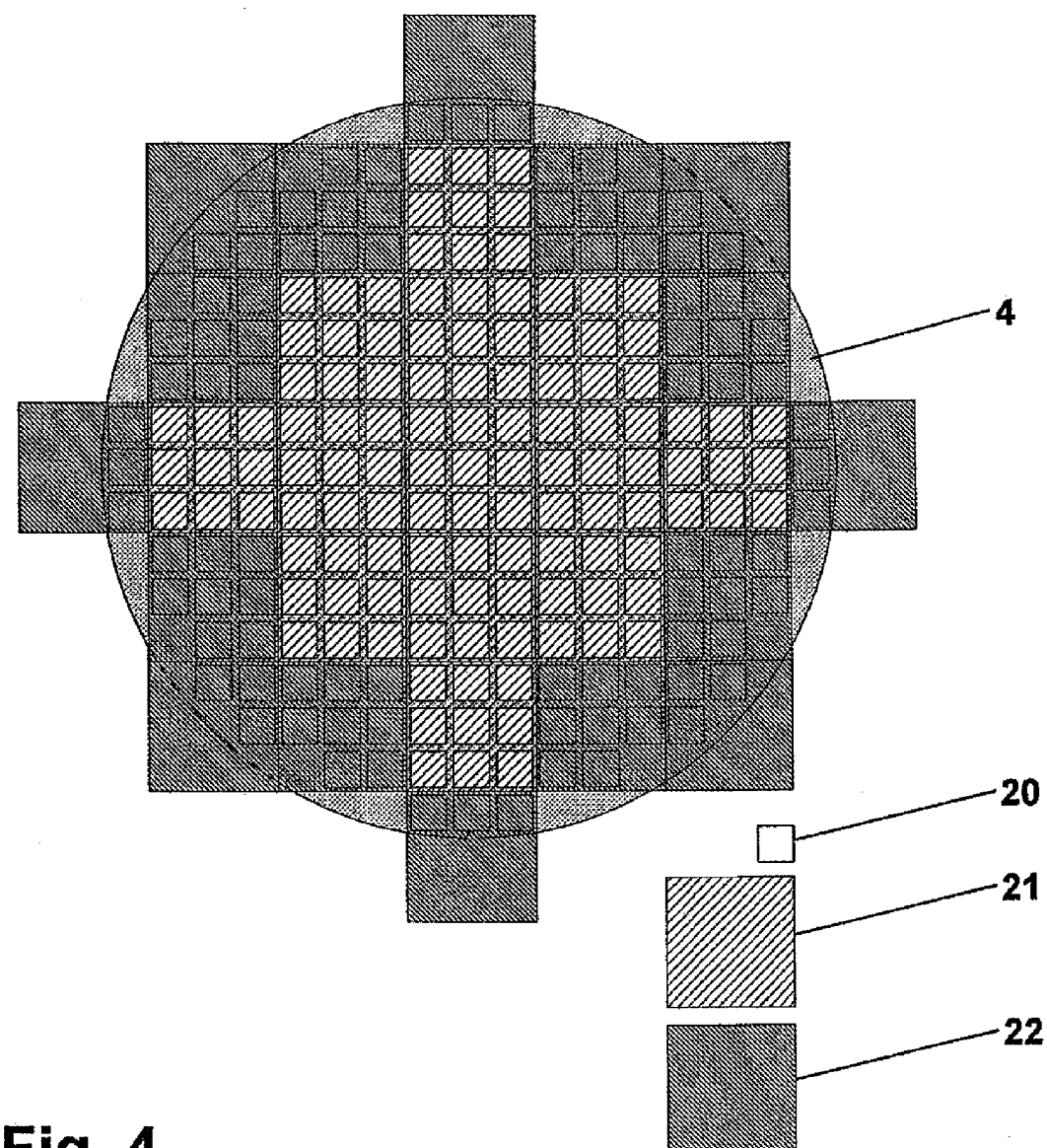
FIG. 4: A diagrammatic representation of the die surfaces on the substrate surface.

In addition, the central control device 15 provides for implementing the step-and-repeat process, i.e., the lowering and raising of the die 1 by the actuator device 10, the subsequent displacement of the substrate 4 by the adjusting device 6 to the next field to be pressed, preferably an adjacent field, whereby the individual fields 21, 22 can consist of several chips 20 (see FIG. 4).

Figure 3:
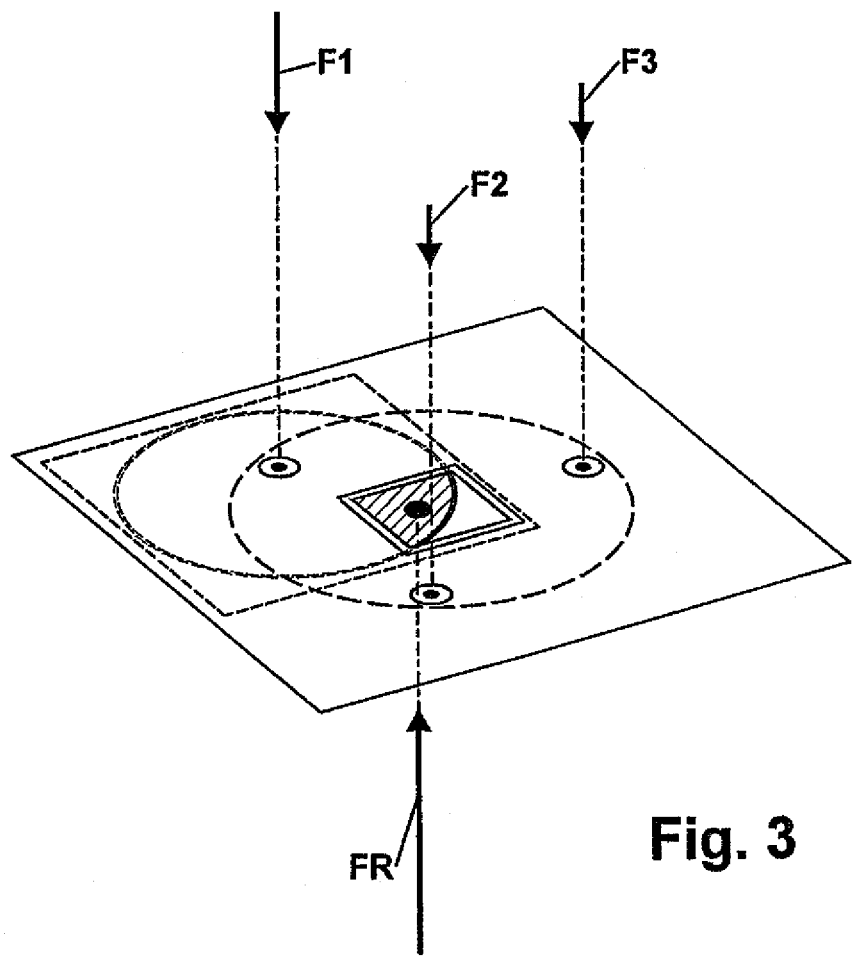
FIG. 3: An isometric representation of the actuator forces and the resultant opposing force FR.

The fields 22 that are darkly cross-hatched in FIG. 4 overlap the substrate 4, and thus the resultant force Fa of the die 1 is placed on the active contract surface in the centroid of the area of the active constant surface between the die surface 1s and a flat side 4s of the substrate 4. This is depicted diagrammatically in FIG. 3, whereby the sum of the force vectors F1, F2 and F3, depicted by arrows, of the compressive forces exerted by the actuators 10.1, 10.2 and 10.3 corresponds to the resultant counterforce FR.

Figure 5:
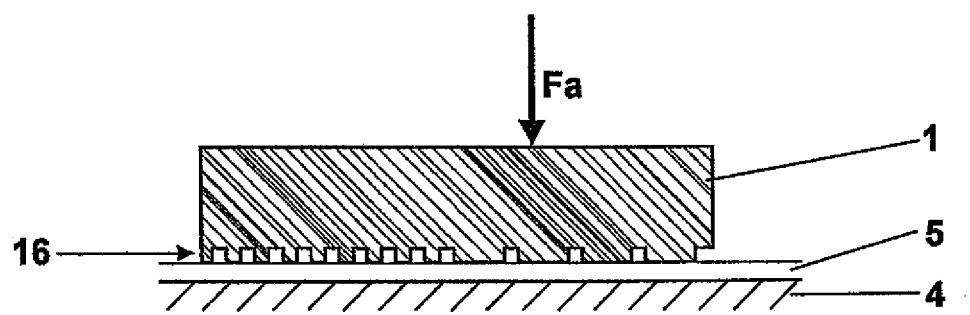
FIG. 5: A side view of a die with an asymmetrical filling factor.

In FIG. 5, the die 1 is depicted with asymmetric structure 16. Based on the asymmetrical structure 16, the resultant force Fa is pushed along in the direction of the side with a higher filling factor and thus presses the die 1 homogenously on the polymer layer 5 and the substrate 4.

The invention claimed is:

1. A system for transferring a shape on a die to a flat side of a large-area substrate, said system comprising:
   a substrate holder having a substrate receiving surface for receiving the substrate,
   a structural surface of the die, the structural surface defining a shape to be transferred to the substrate and being oriented parallel to and located opposite to the substrate receiving surface of the substrate holder,
   an adjusting means having a surface for receiving the substrate holder, the adjusting means for adjusting the position of the substrate relative to the die in an x-direction, y-direction and a rotational direction;
   an actuator device that applies at least two forces in a direction orthogonal to the substrate receiving surface of the substrate holder, wherein the actuator device is comprised of at least two separately controllable actuators that each independently impose a force on the die or substrate, and
   a force measuring cell integrated in each of said separately controllable actuators for measuring the force applied on the die or substrate by each of said separately controllable actuators,
   wherein the forces imposed by the actuators in combination produce a single, controllable resultant force at a predetermined location based on the shape to be transferred to the substrate, and wherein the single, controllable resultant force is orientated in a direction orthogonal to the substrate receiving surface of the substrate holder.

2. A system according to claim 1, wherein the separately controllable actuators impose tensile and compressive forces on the die or substrate that are adjustable.

3. System according to claim 1, in which the actuators can be controlled by a central control device that is connected by control lines to the actuators.

4. System according to claim 1, in which the actuator device has three separately controllable and/or regulatable actuators.

5. System according to claim 1, in which the actuator device has a die holder that transfers the tensile and/or compressive forces to the die, a die holder in particular receiving the die in a central location.

6. System according to claim 1, in which the actuators are arranged uniformly distributed on the periphery of the die holder, in particular with an intermediate angle α of 120°.

7. System according to claim 1, in which the actuator device transfers the tensile and/or compressive forces to the substrate holder.

8. System according to claim 7, in which the actuators are arranged uniformly distributed on the periphery of the die holder, in particular with an intermediate angle α of 120°.

9. System according to claim 1, in which the actuators escape outside of the structural surface.

10. System according to claim 1, in which an adjusting device is provided for translatory and rotating orientation of the substrate parallel to the die.

11. System according to claim 1, in which the adjusting device, the substrate holder and the die are arranged between a lower base plate and a die base plate that is oriented parallel to the lower base plate.

12. System according to claim 11, in which the lower base plate is connected securely to the die base plate via connecting supports that are attached in particular to the edges of the base plate and the die base plate.

13. System according to claim 11, in which the actuators penetrate the die base plate and are guided into the latter orthogonally to the die base plate.

14. System according to claim 1, in which a, in particular piezoelectric, force measuring cell is provided between die or substrate and each of the actuators to measure the tensile and/or compressive forces.

15. System according to claim 14, in which the force measuring cells are connected via control lines to the central control device, and the central control device is designed to control and/or to regulate the actuators with the measured values of the corresponding force measuring cell that is in each case associated with the actuator.

16. System according to claim 1, in which the resultant force Fa acts by the control of the actuator device in the centroid of the area of a contact surface between substrate and die.

17. A system for transferring a shape on a die to a flat side of a large-area substrate, said system comprising:
   a substrate holder having a substrate receiving surface for receiving the substrate,
   a structural surface of the die, said structural surface defining a shape to be transferred to a substrate and being oriented parallel to and opposite to the substrate receiving surface of the substrate holder,
   an actuator device that applies at least two forces in a direction orthogonal to the substrate receiving surface, the actuator device comprised of at least two separately controllable actuators that each independently impose a force on the die, and
   a force measuring cell integrated in each of said separately controllable actuators for measuring the force applied on the die or substrate by each of said separately controllable actuators,
   wherein the forces imposed by the actuators in combination produce a single resultant force at a predetermined location based on the shape to be transferred to the substrate, wherein a length of each actuator is controlled, and wherein the single resultant force is oriented in a direction orthogonal to the substrate receiving surface of the substrate holder.

18. A system for transferring a shape on a die to a flat side of a large-area substrate, said system comprising:
   a substrate holder having a substrate receiving surface for receiving the substrate, a structural surface of the die, the structural surface defining a shape to be transferred to a substrate and being oriented parallel to and opposite to the substrate receiving surface of the substrate holder, the structural surface on the die having an active stamping surface with an area and a centroid of the area, an actuator device that applies at least two forces in a direction orthogonal to the substrate receiving surface, the actuator device comprised of at least two separately controllable actuators that each independently impose a force on the die, and a force measuring cell associated with each of said separately controllable actuators for measuring the force applied on the die or substrate by each of said separately controllable actuators, wherein the forces imposed by the actuators in combination produce a single resultant force at the centroid of the area of the active stamping surface of the die, the single resultant force being oriented in a direction orthogonal to the substrate receiving surface of the substrate holder.

19. A system according to claim 18, wherein the actuators are controllable by a central control device.

20. A system for transferring a shape on a die to a flat side of a large-area substrate, said system comprising:

a substrate holder having a substrate receiving surface for receiving the substrate, an adjusting table having a surface for receiving the substrate holder, wherein the adjusting table is movable in an x-direction, a y-direction and a rotational direction for adjusting the position of the substrate relative to the die, a structural surface of the die, the structural surface defining a shape to be transferred to the substrate and being oriented parallel to and located opposite to the substrate receiving surface of the substrate holder, and an actuator device that applies at least two forces in a direction orthogonal to the substrate receiving surface of the substrate holder, wherein the actuator device is comprised of at least two separately controllable actuators that each independently impose a force on the die or substrate, wherein the forces imposed by the actuators in combination produce a single, controllable resultant force at a predetermined location based on the shape to be transferred to the substrate, wherein the single, controllable resultant force is orientated in a direction orthogonal to the substrate receiving surface of the substrate holder.

* * * * *